United States Patent [19]

Itoh

[11] 4,317,012
[45] Feb. 23, 1982

[54] DISPLAY BOARD TYPE SWITCHING DEVICE

[75] Inventor: Toshiyuki Itoh, Yokosuka, Japan

[73] Assignee: Nissan Motor Company, Limited, Tokyo, Japan

[21] Appl. No.: 141,192

[22] Filed: Apr. 17, 1980

[30] Foreign Application Priority Data

Apr. 26, 1979 [JP] Japan .................. 54-50872

[51] Int. Cl.³ .......................... H01H 1/02
[52] U.S. Cl. .................. 200/5 A; 200/159 B; 200/264; 264/236; 264/277
[58] Field of Search ......... 200/5 A, 5 R, 159 R, 200/159 A, 262, 264, 267, 83 N; 338/99, 100, 114, 118; 340/365 R; 264/277, 236; 29/622

[56] References Cited

U.S. PATENT DOCUMENTS 3,699,294 10/1972 Sudduth .................. 200/5 A
3,879,586 4/1975 DuRocher ................ 200/5 A
4,164,634 8/1979 Gilano .................... 200/5 A

FOREIGN PATENT DOCUMENTS 2006176 4/1973 Fed. Rep. of Germany.
2338746 2/1975 Fed. Rep. of Germany.
2451294 5/1975 Fed. Rep. of Germany.

Primary Examiner—J. V. Truhe
Assistant Examiner—Morris Ginsburg

[57] ABSTRACT

A display board type switching device used for a vehicle or the like, in which pressure sensitive conducting rubber member (7) is integrally molded in a sheet (6) to form a substantially flat plate to rigidly fix the position of the pressure sensitive rubber member. A method for forming such sheet is also described.

8 Claims, 6 Drawing Figures

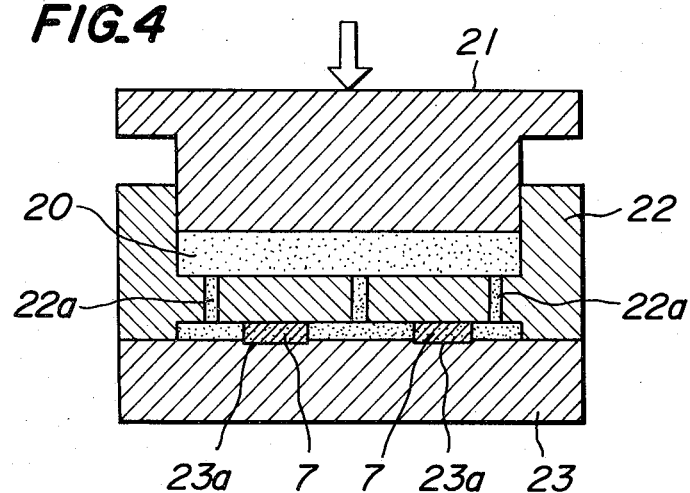
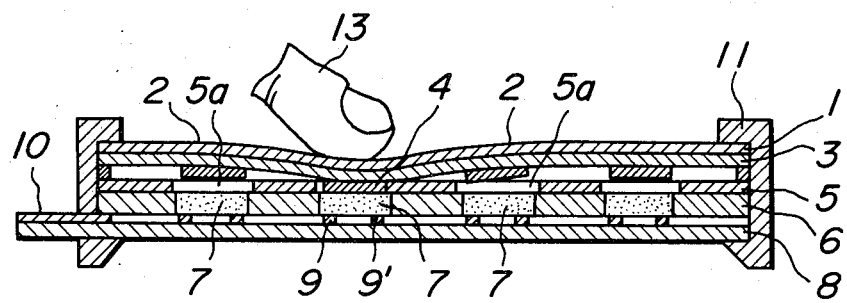
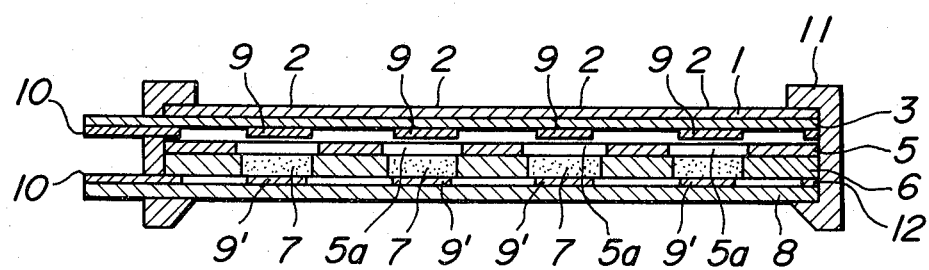

DISPLAY BOARD TYPE SWITCHING DEVICE

BACKGROUND OF THE INVENTION

The present invention relates to a display board type switching device being operated by pressing switching displays positioned on a flexible display board of the device.

In general in a vehicle like an automobile, when operating under load like the wiper or the heater, the driver may operate individual switches by identifying the proper switch by means of a simplified symbol or notation provided thereon.

In order to give an easy identification of the switches and to improve the switching, a display type switch having a flexible board illustrating respective vehicle portions had been proposed.

One such proposal is to arrange a flexible display board having a picture of vehicle portions and an insulating sheet at the rear side thereof and portions in the insulating sheet corresponding to the desired switching position are cut and pressure sensitive conducting rubber members are placed in the cut portions so that by depressing the said switching position of the display board a corresponding pressure sensitive conducting rubber member is pressed, which becomes conductive to operate the desired load.

In such a display type switching device, the pressure sensitive conducting rubber members are located in the recesses of the insulating sheet at corresponding switching positions. If there is deviation among the size of the pressure sensitive conducting rubber members, various problems may be caused. When such a member is larger than a predetermined size, the member may be bent when it is inserted in the corresponding recess or cut portion and by lateral pressure applied thereon it is pressed towards top or bottom direction so that a small depression force causes conduction of the member and misoperation may result.

A further proposal had been made to provide clearances between the conducting body or electrode and the pressure sensitive conducting rubber member. But if the rubber member is too small and not closely fit in the cut portion, the member may shift in position due to the vibration of the vehicle during running to cause incomplete conduction.

SUMMARY OF THE INVENTION

The present invention is to overcome the aforementioned disadvantages of the prior art switching devices of this kind. In the present invention, the flexible display board type switching device being activated by depression of the respective switching positions comprises a sheet member unitarily formed with the pressure sensitive conducting rubber members and an insulating rubber surrounding the conducting rubber members in order to hold the members accurately in fixed position.

DESCRIPTION OF THE DRAWING

FIG. 4 is a cross-sectional view of a forming device for forming an insulating sheet holding the pressure sensitive conducting rubber;

FIG. 5 is a cross-sectional view illustrating a condition of depressing the switching position by a finger in the above embodiment; and FIG. 6 is a cross-sectional view for showing a different embodiment.

DESCRIPTION OF THE PREFERRED EMBODIMENTS

The invention will now be described by referring to embodiments shown in the accompanied drawings.

Figure 1:
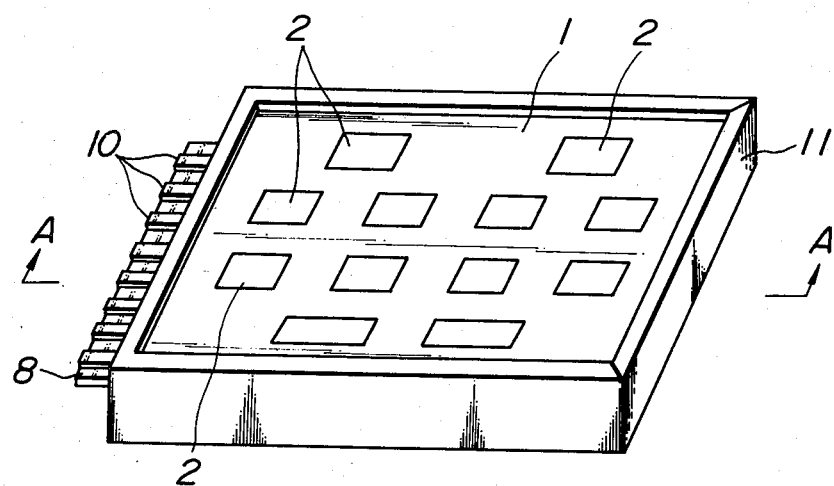
FIG. 1 is a perspective view for showing one embodiment of the present invention.
Figure 2:
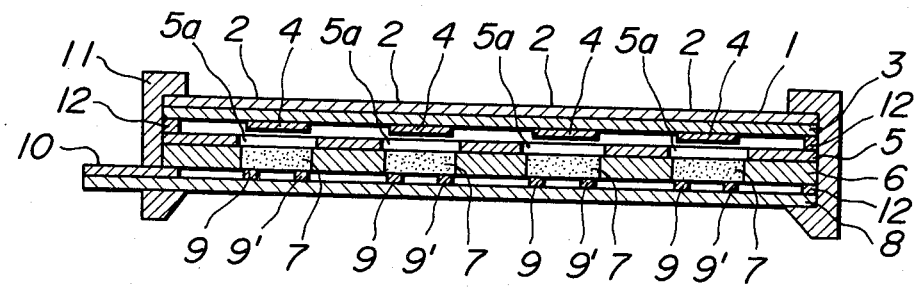
FIG. 2 is a cross-sectional view taken along line A—A thereof.
Figure 3:
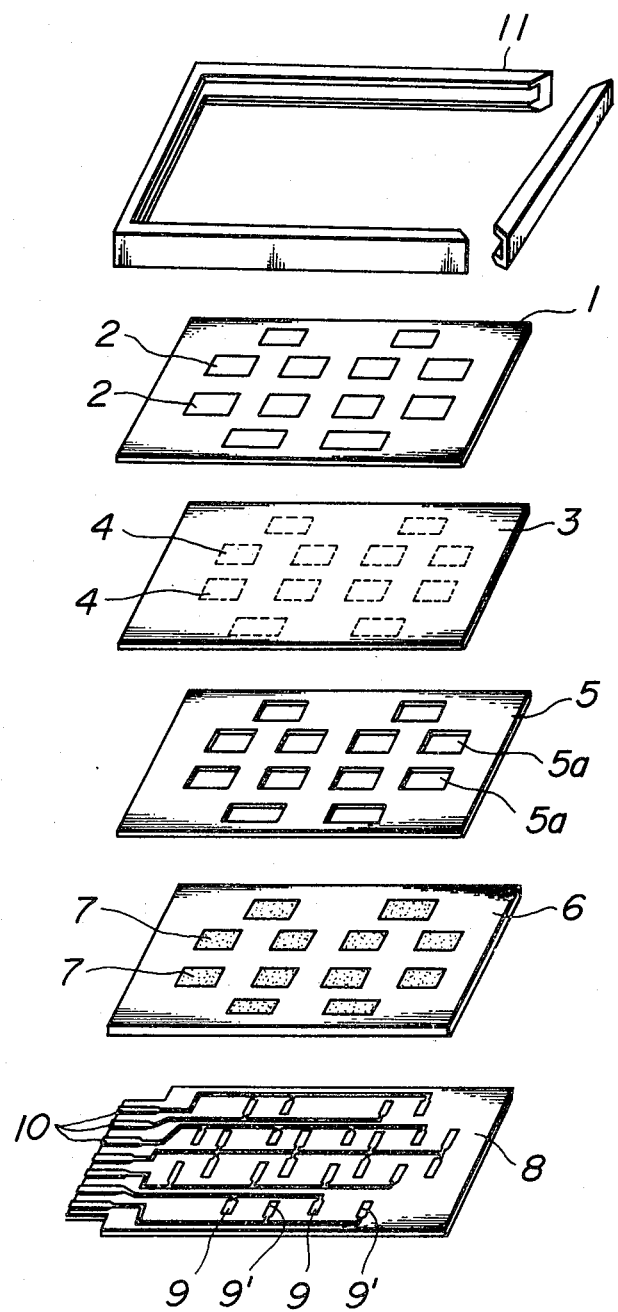
FIG. 3 is an exploded view thereof.

In the figures, reference numeral 1 designates a flexible display board having a number of switching positions 2 illustrated thereon. A flexible printed base board 3 is arranged and a number of conducting bodies 4 are fixed at rear side thereof at positions corresponding to the respective switching positions. 5 is a hard base plate having cut portions 5a at positions corresponding to the respective switch positions 2. 6 is a sheet holding the pressure sensitive conductive rubber members 7 located at positions corresponding to the switching positions 2. This sheet 6 is formed in a manner described hereinafter. 8 is a hard printed circuit base plate and on the surface thereof each pair of electrodes 9 and 9' are arranged at positions corresponding to the switching positions. These electrodes are connected to a plurality of terminals 10 arranged on a projecting end portion of the printed base plate 8. An outer frame 11 is provided and as can be better seen from FIG. 2, it holds the flexible display board 1, the printed base plate 3, the base plate 5, the sheet 6 and the printed base plate 8 stacked in this order with an interposition of spacers 12 for instance by caulking or the like.

The abovementioned pressure sensitive conducting rubber member 7 has a thickness of about 0.5 to 1.0 mm and it changes the resistance value abruptly by an application of depressing force over a certain value. The range of change of the resistance value is from an insulating condition to a good conducting condition and the direction of conduction is the same as that of the application of the pressure. The material of the conducting rubber is generally silicon rubber dispersed with conducting metal particles, however, it may be other elastic materials like plastics.

In the above switching device, the sheet 6 may be manufactured by using a molding device as shown in FIG. 4. This forming device comprises an extruding mold 21 for extruding molten forming material 20, which in this embodiment is gel like insulating rubber compound, an upper mold 22 for passing the forming material 20 downwardly through gates 22a and a lower mold 23 for forming the extruded forming material 20 in a flat plate. The upper surface of the lower mold 23 is provided with depressions 23a of about 0.1-0.2 mm in depth for securing the pressure sensitive conducting rubber members 7 at positions corresponding to the respective switch positions.

Said sheet 6 is manufactured by using this mold in the following steps.

(1) Arranging the pressure sensitive conducting rubber members 7 in the depressions 23a of the lower mold 23.

(2) The gel like rubber compound 20 which has been introduced in the upper mold 22 is extruded by using the extruding mold 21 through the gates 22a to the space surrounding the pressure sensitive conducting rubber members 7.

(3) The rubber compound 20 is vulcanized in the space between the upper mold 22 and the lower mold 23 to form a flat silicon rubber plate having substantially the same height as that of said pressure sensitive conducting rubber member 7.

In the sheet 6 formed in the above process, the silicon rubber closely adheres around the pressure sensitive conducting rubber members 7 so that the rubber members 7 are closely held and are able to be pressed without any risk of exceeding clearances.

In the abovementioned embodiment, the insulating material is silicon rubber having substantially the same properties as that of the pressure sensitive conducting rubber 7, however, other forming material such as plastics may be used.

The sheet 6 formed in the above process has the pressure sensitive conducting rubber member 7 slightly projecting downwardly. If such downward projection is to be avoided, the following method may be used. Namely, the plate to shape insulating material may be cut in the positions corresponding to the respective switching positions over a size slightly larger than the size of the respective pressure sensitive conducting member 7 and the members 7 are arranged in said cut positions and the clearance formed therebetween is filled by the rubber compound and vulcanized to form a flat plate and a sheet having no projection downwardly can be manufactured.

The switching device as explained in the above embodiment is shown in FIG. 5. As shown in FIG. 5, by depressing the switching position 2 on the flexible display panel 1 by a finger 13, the conductor 4 provided on the lower face of the printed base plate 3 enters in the cut position 5a of the hard base plate 5 and the pressure sensitive conducting rubber member 7 is depressed thereby and it becomes conductive in vertical (up-down) direction to switch on a desired load. In this case, the printed base 3 abuts against the fringe of the cut portion 5a of the hard base plate 5 so that there will be no danger that the adjacent conductor 4 located at the adjacent switching position may press the pressure sensitive conducting rubber members 7 corresponding thereto. In the above embodiment, a hard base plate 5 is provided between the flexible printed base 3 and the composite sheet 6 so as to prevent misoperation even when there are a number of switching positions. However, if a sufficient space can be provided between the switching positions, the above-mentioned hard base board may be dispensed with.

Furthermore in the above embodiment, the conductor 4 is provided above the pressure sensitive conducting rubber member 7 and a pair of electrodes are provided therebelow. But the present invention is not limited to such arrangement. As shown in FIG. 6, a first electrode 9 may be provided above the pressure sensitive conducting rubber 7 and a second electrode 9' may be arranged downside thereof. If a sufficient space between the switches may be obtained, the hard base plate 5 can be dispensed with as same as the above embodiment.

The switching device according to the present invention comprises the composite sheet member which has been manufactured in the aforementioned method and which holds the pressure sensitive conducting members very rigidly so that it may easily be manufactured if compared with conventional methods in which an insulating sheet is cut at the switching positions and the pressure sensitive conducting rubber members are placed therein and as the sheet rigidly holds the members no clearance exists therebetween. The pressure sensitive rubber members may not be pressed laterally from the surroundings and hence the misoperation of the switches may be avoided.

What is claimed is

1. A switching device, comprising;
    a flexible display board having a number of switching positions,
    a sheet member in parallel and slightly spaced relationship with said flexible display board,
    a number of pressure sensitive conducting rubber members integrally molded with said sheet member and disposed in corresponding positions to said switching positions respectively,
    a pair of electrodes at positions corresponding to and connectable through each of said rubber members,
    a hard base plate having cutout holes at positions corresponding to said respective switching positions disposed between said flexible display board and said sheet member, and
    conducting bodies at said switching positions respectively contactable with the upper side of said conducting rubber members.

2. A switching device according to claim 1, wherein said pair of electrodes are disposed on the lower side of said conducting rubber members and opposite said conducting bodies.

3. A switching device as claimed in claim 1 wherein one of said pair of electrodes is disposed at the corresponding one of said switching positions and on the upper side of said conducting rubber members, and the other of said pair of electrodes is disposed on the opposite side of said corresponding rubber member and electrode.

4. A switching device as claimed in claim 1, wherein said sheet member is made of silicon rubber.

5. A switching device as claimed in claim 1, wherein said sheet member is made of plastics.

6. A method for manufacturing a sheet member for a pressure sensitive display board switching device and having a number of pressure sensitive conducting rubber members integrally molded with said sheet member, comprising the steps of;
    arranging the number of pressure sensitive conducting rubber members at corresponding switching positions in a lower mold,
    extruding gel-like insulative rubber compound from an upper mold by an extruding mold, and
    vulcanizing the insulative rubber compound in the lower mold and thereby forming a flat rubber sheet having substantially the same height as that of the pressure sensitive conducting rubber members with said conducting rubber members being embedded in the insulative sheet.

7. A method as claimed in claim 6, wherein the lower mold is provided with depressions for fixing the pressure sensitive rubber members at the corresponding switching positions.

8. A method as claimed in claim 6, wherein the pressure sensitive rubber members are placed in fixed position in the lower mold by using an insulative sheet provided with cut portions corresponding to the respective switching positions and each cut is slightly larger than the rubber member, and thereafter the insulative rubber compound is extruded into the mold to bind said pressure sensitive members to said insulative sheet.

* * * * *